United States Patent
Miyazaki

(10) Patent No.: US 8,363,416 B2
(45) Date of Patent: Jan. 29, 2013

(54) DISPLAY DEVICE IN WHICH FLEXIBLE WIRING BOARD IS PROTECTED

(75) Inventor: Hiroyuki Miyazaki, Mutsuzawa (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 210 days.

(21) Appl. No.: 12/828,563

(22) Filed: Jul. 1, 2010

(65) Prior Publication Data

US 2011/0002105 A1 Jan. 6, 2011

(30) Foreign Application Priority Data

Jul. 6, 2009 (JP) ................................. 2009-159627

(51) Int. Cl.
*H05K 1/00* (2006.01)
(52) U.S. Cl. ............................ 361/749; 349/58; 349/150
(58) Field of Classification Search .................. 361/749; 349/58, 150
See application file for complete search history.

(56) References Cited

U.S. PATENT DOCUMENTS

| | | | |
|---|---|---|---|
| 6,597,416 B1 * | 7/2003 | Momose | 349/60 |
| 6,703,702 B2 * | 3/2004 | Inoue et al. | 257/684 |
| 6,729,888 B2 * | 5/2004 | Imaeda | 439/66 |
| 6,924,855 B2 | 8/2005 | Chung | |
| 7,432,998 B2 * | 10/2008 | Nishio et al. | 349/58 |
| 7,595,983 B2 * | 9/2009 | Okuda | 361/679.56 |
| 7,766,680 B2 | 8/2010 | Suzuki et al. | |
| 7,808,599 B2 * | 10/2010 | Nakanishi | 349/150 |
| 2001/0012706 A1 | 8/2001 | Imaeda | |
| 2002/0084995 A1 | 7/2002 | Chung | |
| 2005/0078459 A1 * | 4/2005 | Yeon | 361/749 |
| 2005/0088830 A1 * | 4/2005 | Yumoto et al. | 361/749 |
| 2007/0290965 A1 | 12/2007 | Shiraishi | |
| 2008/0218655 A1 | 9/2008 | Won | |
| 2009/0147175 A1 | 6/2009 | Tsumura et al. | |

FOREIGN PATENT DOCUMENTS

| | | |
|---|---|---|
| CN | 101442161 | 5/2009 |
| JP | 07-128680 | 5/1995 |
| JP | 2009-139704 | 6/2009 |
| KR | 10-2002-0057319 | 7/2002 |

* cited by examiner

*Primary Examiner* — Angel R Estrada
*Assistant Examiner* — Dimary Lopez
(74) *Attorney, Agent, or Firm* — Antonelli, Terry, Stout & Kraus, LLP.

(57) ABSTRACT

Provided is a display device including: a display panel; a circuit board; a connector mounted on the circuit board; a flexible wiring board attached to the connector; and a housing which accommodates the display panel, the circuit board, and one part of the flexible wiring board, and includes a slit formed therein, from which another part of the flexible wiring board is pulled out. The flexible wiring board includes, in the one part of the flexible wiring board, a first region extending in directions which intersect a pull-out direction from the slit, and having a width which is larger than a width of the flexible wiring board at a position overlapping the slit.

17 Claims, 6 Drawing Sheets

DISPLAY DEVICE IN WHICH FLEXIBLE WIRING BOARD IS PROTECTED

CROSS-REFERENCE TO RELATED APPLICATION

The present application claims priority from Japanese application JP 2009-159627 filed on Jul. 6, 2009, the content of which is hereby incorporated by reference into this application.

BACKGROUND OF THE INVENTION

1. Field of the Invention

The present invention relates to a display device.

2. Description of the Related Art

There is known a structure of a liquid crystal display device, in which a connector is mounted on a circuit board and a flexible printed wiring board (FPC) is attached to the connector in a detachable manner. Specifically, a cover is attached so as to cover the circuit board, and an opening is formed in the cover. The connector is disposed in the opening, and the flexible printed wiring board is attached to the connector via the opening. For example, Japanese Patent Application Laid-open No. 2009-139704 discloses a structure in which a flexible printed wiring board is attached to a circuit board, and a part of the flexible printed wiring board and the circuit board are covered with a cover.

In the conventional structure, although the circuit board is covered with the cover, the flexible printed wiring board is exposed from the cover. Accordingly, the cover does not effect a function of protecting the flexible printed wiring board. Further, if the cover serves simply to cover the flexible printed wiring board, once the flexible printed wiring board is detached from the connector by, for example, being applied with a stress such as pulling the flexible printed wiring board, it is required that the cover be detached in order to attach the flexible printed wiring board to the connector again.

SUMMARY OF THE INVENTION

The present invention has an object to provide a display device in which a flexible wiring board is protected while preventing the flexible wiring board from being detached from a connector.

(1) A display device according to the present invention includes: a display panel; a circuit board; a connector mounted on the circuit board; a flexible wiring board attached to the connector in, for example, a detachable manner; and a housing for accommodating the display panel, the circuit board, and one part of the flexible wiring board, in which: the housing includes a slit formed therein, from which another part of the flexible wiring board is pulled out; and the flexible wiring board includes, in the one part of the flexible wiring board, a first region (inner side stopper) extending in directions which intersect a pull-out direction from the slit, and having a width which is larger than a width of the flexible wiring board at a position overlapping the slit. According to the present invention, the flexible wiring board is prevented from slipping out by the first region (inner side stopper), and protected because the one part thereof is accommodated in the housing.

(2) In the display device described in Item (1), the first region (inner side stopper) may be a part of a sheet which is adhered to the flexible wiring board.

(3) In the display device described in Item (1), the flexible wiring board may further include, in the another part of the flexible wiring board, a second region (outer side stopper) extending in the directions which intersect the pull-out direction from the slit, and having a width which is larger than the width of the flexible wiring board at the position overlapping the slit.

(4) In the display device described in Item (3), each of the first region (inner side stopper) and the second region (outer side stopper) may be a part of a sheet which is adhered to the flexible wiring board.

(5) In the display device described in any one of Items (1) to (4), the housing may include a frame which surrounds a peripheral portion of the display panel and a cover for covering the circuit board, and the slit may be formed between the frame and the cover.

(6) In the display device described in Item (5), the cover may cover an entirety of the circuit board and the connector.

(7) In the display device described in Item (5), the cover may include an opening, the connector may be disposed at a position overlapping the opening, and the flexible wiring board may have a portion between the connector and the slit, which is covered with the cover.

(8) In the display device described in any one of Items (1) to (7), the cover may be made of an electromagnetic wave shielding material.

DETAILED DESCRIPTION OF THE INVENTION

Hereinafter, an embodiment of the present invention is described with reference to the accompanying drawings.

Figure 1:
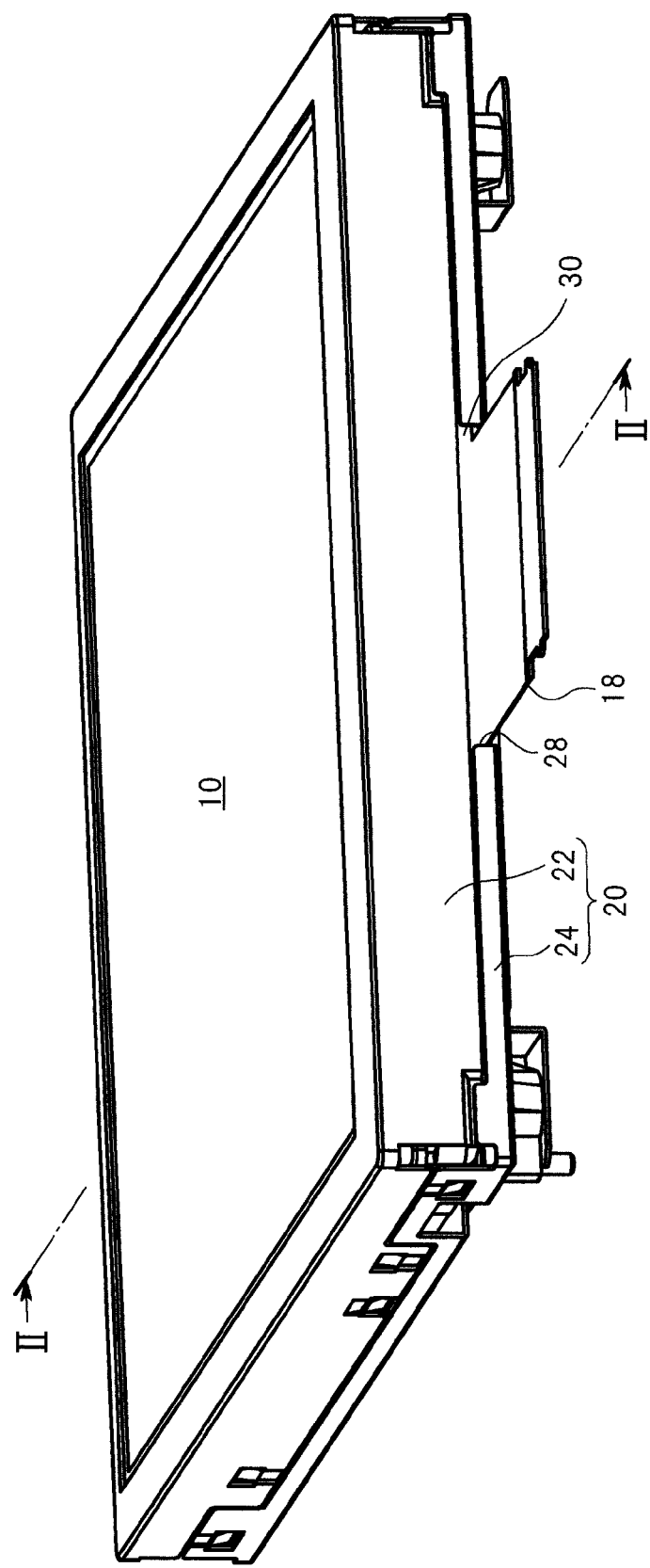
FIG. 1 is a perspective view illustrating a display device according to an embodiment of the present invention.
Figure 2:
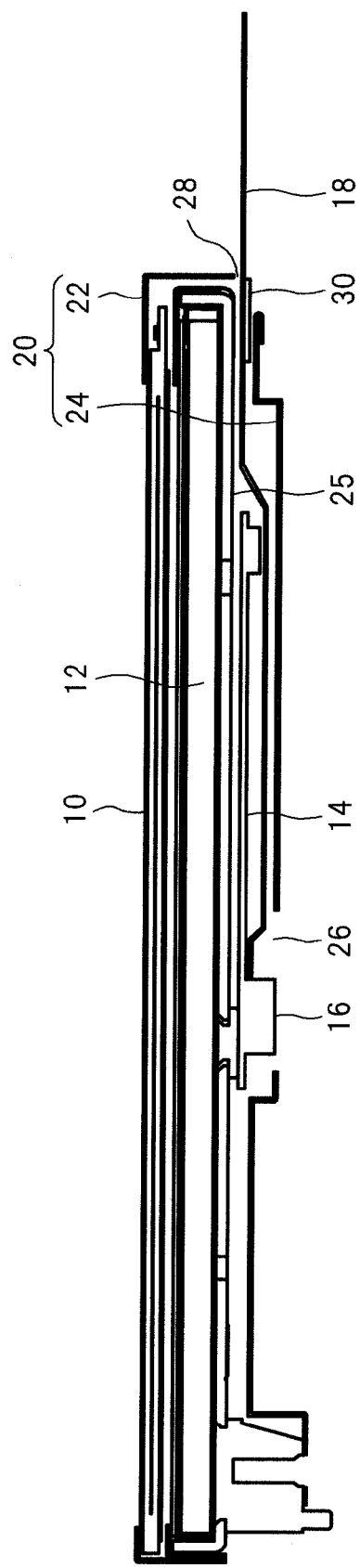
FIG. 2 is a cross-sectional view taken along the line II-II of the display device illustrated in FIG. 1.
Figure 3:
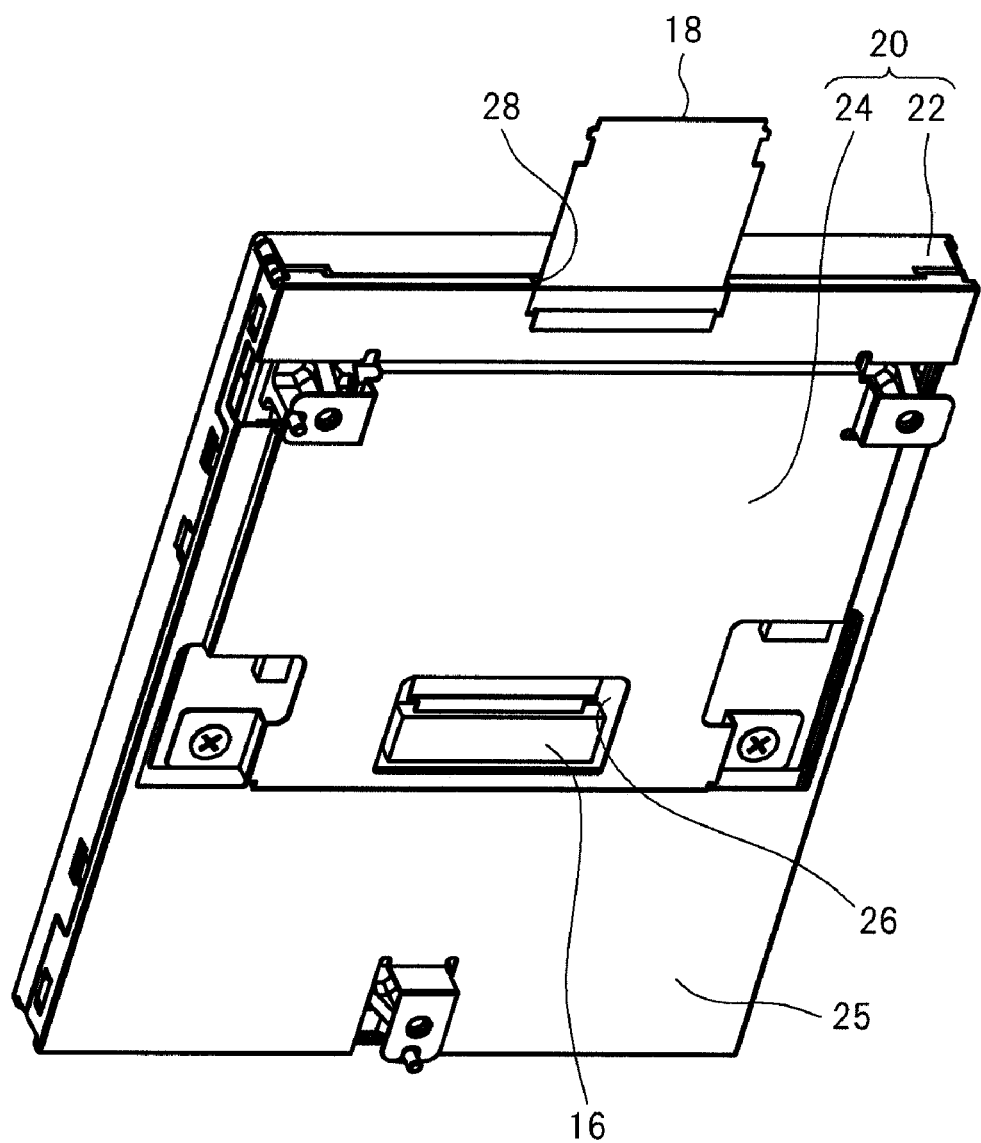
FIG. 3 is a bottom view illustrating the display device according to the embodiment of the present invention.

FIG. 1 is a perspective view illustrating a display device according to the embodiment of the present invention. FIG. 2 is a cross-sectional view taken along the line II-II of the display device illustrated in FIG. 1. FIG. 3 is a bottom view illustrating the display device according to the embodiment of the present invention.

The display device includes a display panel 10. The display panel 10 is a liquid crystal display panel and is disposed so that the display panel 10 overlaps a backlight 12 as illustrated in FIG. 2. The backlight 12 includes, for example, a light source such as a cold cathode fluorescent lamp (CCFL) or a light emitting diode (LED), an optical sheet such as a reflective sheet or a diffusion sheet, a light guide plate, and the like. The display panel 10 is not limited to a liquid crystal display panel and may include an organic electroluminescence display panel. In that case, the backlight 12 is not provided.

The display device includes a circuit board 14. The circuit board 14 includes a power supply circuit for driving the display panel 10, and the like. For example, the circuit board 14 may include a TCON board or a power supply circuit board. As illustrated in FIG. 2, the circuit board 14 is disposed on a back surface of a box-shaped member 25 storing the backlight 12. A connector 16 is mounted on the circuit board 14. A flexible wiring board 18 (FPC) is attached to the connector 16 in a detachable manner for electrical connection to the outside. Because the flexible wiring board 18 is provided detachable, the flexible wiring board 18 may be replaced (repaired).

The display device includes a housing 20. The housing 20 accommodates the display panel 10, the circuit board 14, and a part of the flexible wiring board 18. The housing 20 includes a frame 22 which surrounds a peripheral portion of the display panel 10. The housing 20 also includes a cover 24 which covers at least a part of the circuit board 14. By forming the cover 24 of an electromagnetic wave shielding material (for example, conductive material such as metal), electromagnetic interference (EMI) (unnecessary radiation) may be prevented.

As illustrated in FIGS. 2 and 3, an opening 26 is formed in the cover 24. The connector 16 is disposed in a region of the circuit board 14 which overlaps the opening 26. A connection portion between the connector 16 and the flexible wiring board 18 is exposed from the cover 24, and hence the flexible wiring board 18 may be provided detachable.

A slit 28 is formed in the housing 20. The slit 28 is formed between the frame 22 and the cover 24. That is, the slit 28 is formed by fitting the frame 22 and the cover 24. In other words, a part of the frame 22 and a part of the cover 24 form the slit 28. A part of the flexible wiring board 18 is pulled out from the slit 28 of the housing 20. The flexible wiring board 18 has a portion between the connector 16 and the slit 28, which is covered with the cover 24.

Figure 4:
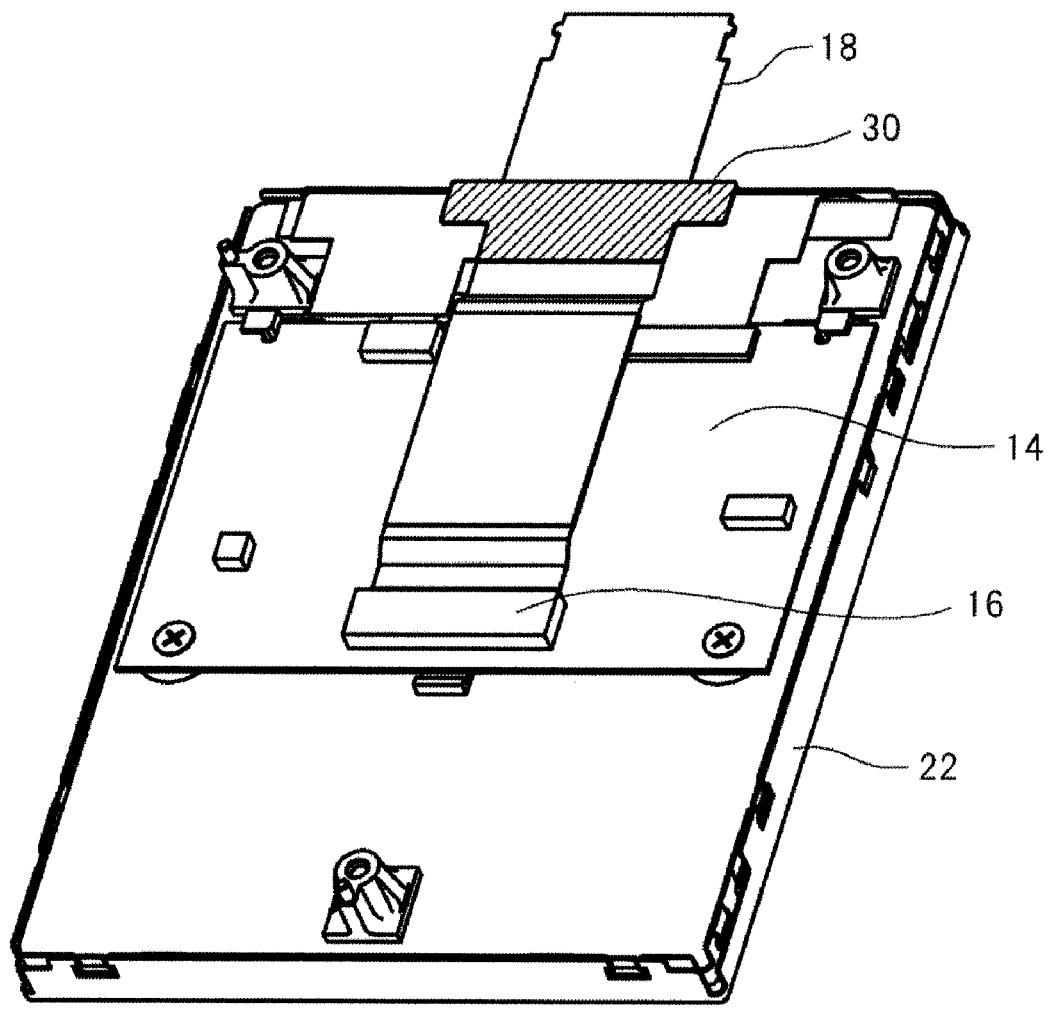
FIG. 4 is a view illustrating a state where a cover is detached from the display device illustrated in FIG. 3.

FIG. 4 is a view illustrating a state where the cover 24 is detached from the display device illustrated in FIG. 3. The flexible wiring board 18 includes an inner side stopper 30. The inner side stopper 30 is disposed in the vicinity of the slit 28 on a side where the flexible wiring board 18 is covered with the cover 24. The inner side stopper 30 extends in both directions which intersect a pull-out direction of the flexible wiring board 18 from the slit 28 (in addition, direction parallel to surface of flexible wiring board 18). A width of a portion of the flexible wiring board 18 which is pulled out from the slit 28 to the outside is smaller than a length of the slit 28 so that the portion of the flexible wiring board 18 may pass through the slit 28. On the other hand, a width of the inner side stopper 30 (length in directions which intersect pull-out direction of flexible wiring board 18 from slit 28) is larger than the length of the slit 28. That is, the inner side stopper 30 is a region which has a width larger than that of the flexible wiring board 18 at a position overlapping the slit 28, and is formed on the side where the flexible wiring board 18 is covered with the cover 24. Therefore, the inner side stopper 30 prevents the flexible wiring board 18 from slipping out in an outer direction from the slit 28.

The opening 26 of the cover 24 is an occasional portion used in order to replace (repair) the flexible wiring board 18. Therefore, the size thereof may be limited to a minimum. In other words, regardless of the size of the opening 26 of the cover 24, an original assembling process may be easily performed.

The inner side stopper 30 illustrated in FIG. 4 is a part of a sheet formed of polyethylene terephthalate (PET) or the like, and is adhered to the flexible wiring board 18. Such inner side stopper 30 may be adhered to the flexible wiring board 18 in advance before the flexible wiring board 18 is attached to the connector 16. As a modified example, the inner side stopper 30 may be integrally formed with a base of the flexible wiring board 18.

According to this embodiment, a part of the flexible wiring board 18 is accommodated in the housing 20, and hence the flexible wiring board 18 may be more sufficiently protected than the case of a structure in which only the circuit board is covered with the cover and the flexible wiring board is disposed outside the cover. Further, a layer thickness of the display device may be more reduced than the case of the structure in which the flexible wiring board is disposed outside the cover.

Further, the flexible wiring board 18 is prevented from slipping out by the inner side stopper 30, and hence a potential for the flexible wiring board 18 to be detached from the connector 16 may be significantly reduced.

Further, in order to prevent the slipping out, a method of fixing the flexible wiring board with, for example, an adhesive tape may be conceived. In this embodiment, compared with the method of fixing the flexible wiring board with the adhesive tape, a process of adhering the adhesive tape may be reduced and the number of components may be reduced (adhesive tape is unnecessary).

First Modified Example

Figure 5:
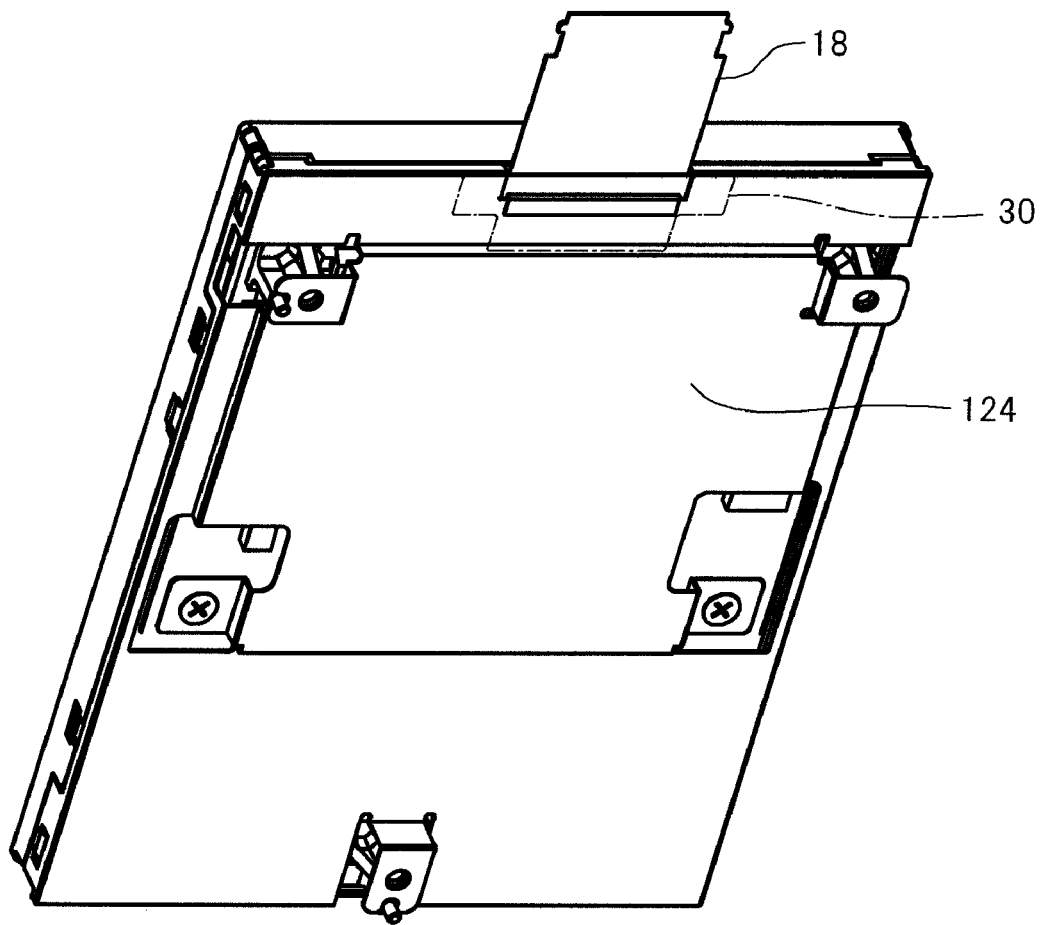
FIG. 5 is a perspective view illustrating a first modified example of the display device according to the embodiment of the present invention.

FIG. 5 is a perspective view illustrating a first modified example of the display device according to the embodiment of the present invention. This modified example differs from the embodiment described above in that a cover 124 covers the entire circuit board 14 and the connector 16 illustrated in FIG. 2 (that is, opening 26 is not provided). According to this modified example, the cover 124 covers the entire circuit board 14, and hence by forming the cover 124 of an electromagnetic wave shielding material, electromagnetic interference (EMI) (unnecessary radiation) may be completely prevented. In addition, the cover 124 covers the connection portion between the flexible wiring board 18 and the connector 16, and hence protection is improved. Other details of the display device according to this modified example correspond to the contents described in the above-mentioned embodiment.

Second Modified Example

Figure 6:
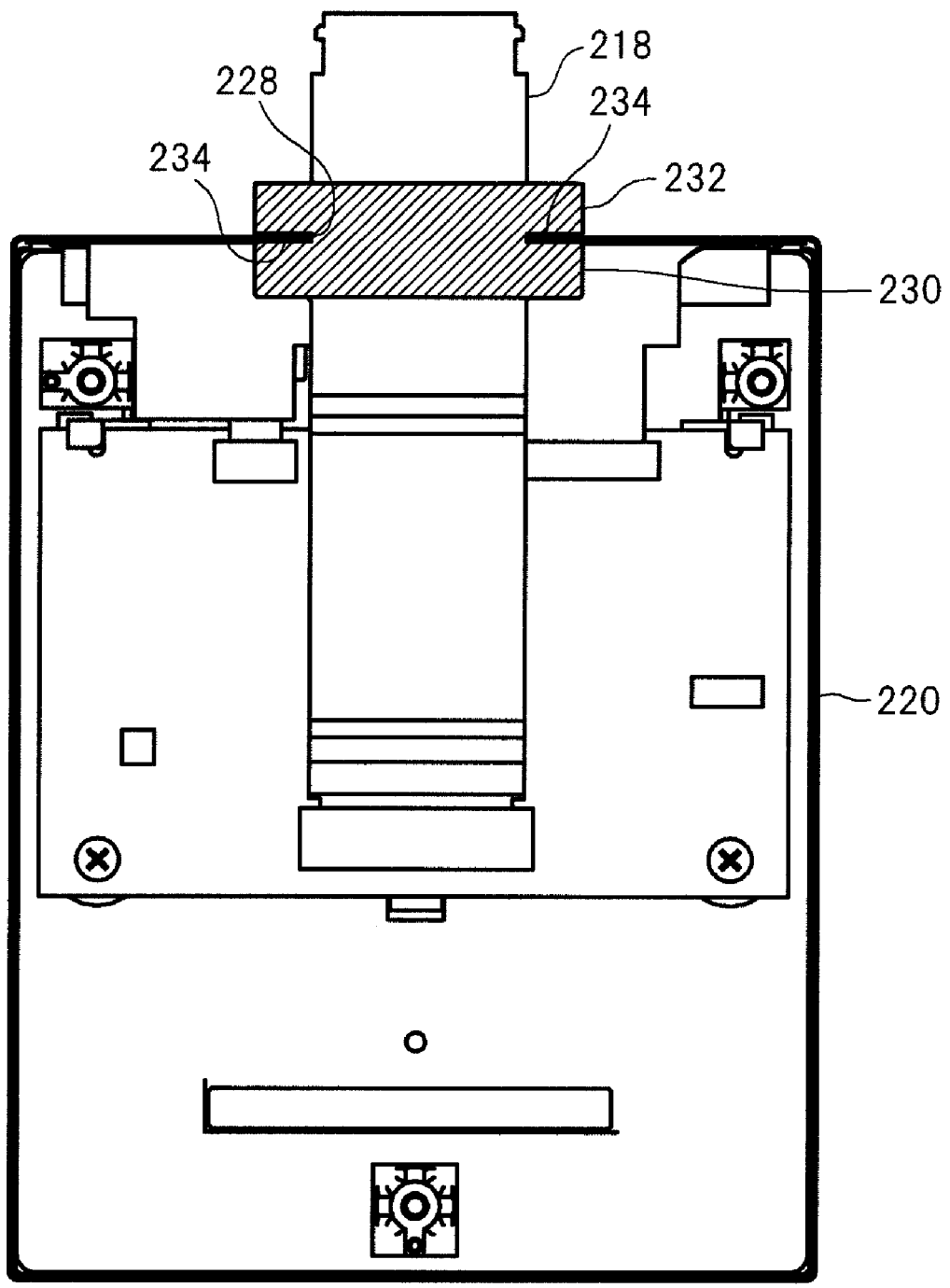
FIG. 6 is a view illustrating a second modified example of the display device according to the embodiment of the present invention.

FIG. 6 is a view illustrating a second modified example of the display device according to the embodiment of the present invention. In this modified example, a flexible wiring board 218 further includes an outer side stopper 232 together with an inner side stopper 230. The outer side stopper 232 is provided on an outer side of a housing 220 and extends in directions which intersect a pull-out direction of the flexible wiring board 218 from a slit 228. That is, the outer side stopper 232 is a region which has a larger width than that of the flexible wiring board 218 at a position overlapping the slit 228, and is formed on a side where the flexible wiring board 218 is not covered with the cover. Because the outer side stopper 232 is provided, the flexible wiring board 218 is prevented from entering in an inner direction from the slit 228. In addition, it is possible to obtain an effect of preventing the flexible wiring board 218 from moving (clattering) in the cover in a thickness direction of the display device (normal direction with respect to main surface of display panel 10).

Each of the inner side stopper 230 and the outer side stopper 232 is a part of a sheet adhered to the flexible wiring board 218, and a portion between a pair of notches 234 formed in directions facing each other is disposed in the slit 228. Other details of the display device according to this modified example correspond to the contents described in the above-mentioned embodiment.

The present invention is not limited to the embodiment described above, and various modifications may be made thereto. For example, the structure described in the embodiment may be replaced by substantially the same structure, a structure having the same action and effect, and a structure which may achieve the same object.

What is claimed is:

1. A display device, comprising:
a display panel;
a circuit board;
a connector mounted on the circuit board;
a flexible wiring board attached to the connector; and
a housing for accommodating the display panel, the circuit board, and one part of the flexible wiring board, wherein:
the housing includes a frame and a cover that fit with respect to each other so as to form a slit between the frame and the cover, from which another part of the flexible wiring board is pulled out;
the flexible wiring board includes, in the one part of the flexible wiring board, a first region extending in directions which intersect a pull-out direction from the slit, and having a width which is larger than a width of the flexible wiring board at a position overlapping the slit; and
the flexible wiring board includes, in the another part of the flexible wiring board, a second region extending in the directions which intersect the pull-out direction from the slit, and having a width which is larger than the width of the flexible wiring board at the position overlapping the slit.

2. The display device according to claim 1, wherein the first region comprises a part of a sheet which is adhered to the flexible wiring board.

3. The display device according to claim 2, wherein
the frame surrounds a peripheral portion of the display panel and
the cover covers the circuit board.

4. The display device according to claim 3, wherein the cover covers an entirety of the circuit board and the connector.

5. The display device according to claim 3, wherein:
the cover includes an opening;
the connector is disposed at a position overlapping the opening; and
the flexible wiring board has a portion between the connector and the slit, which is covered with the cover.

6. The display device according to claim 1, wherein each of the first region and the second region comprises a part of a sheet which is adhered to the flexible wiring board.

7. The display device according to claim 6, wherein the frame surrounds a peripheral portion of the display panel and the cover for covering covers the circuit board.

8. The display device according to claim 7, wherein the cover covers an entirety of the circuit board and the connector.

9. The display device according to claim 7, wherein:
the cover includes an opening;
the connector is disposed at a position overlapping the opening; and
the flexible wiring board has a portion between the connector and the slit, which is covered with the cover.

10. The display device according to claim 1, wherein
the frame surrounds a peripheral portion of the display panel and
the cover covers the circuit board.

11. The display device according to claim 10, wherein the cover covers an entirety of the circuit board and the connector.

12. The display device according to claim 11, wherein the cover is made of an electromagnetic wave shielding material.

13. The display device according to claim 10, wherein:
the cover includes an opening;
the connector is disposed at a position overlapping the opening; and
the flexible wiring board has a portion between the connector and the slit, which is covered with the cover.

14. The display device according to claim 13, wherein the cover is made of an electromagnetic wave shielding material.

15. The display device according to claim 10, wherein the cover is made of an electromagnetic wave shielding material.

16. The display device according to claim 1, wherein the first and second regions having the larger width have portions which are spaced from one another in the pull-out direction at opposite sides of the slit with respect to the width of the flexible wiring board at the position overlapping the slit.

17. The display device according to claim 16, wherein one of the spaced portions of the first and second regions having the larger width being disposed within the housing and another of the spaced portions of first and second regions having the larger width being disposed outside of the housing.

* * * * *